United States Patent
Rho

(10) Patent No.: US 8,713,407 B2
(45) Date of Patent: Apr. 29, 2014

(54) SEMICONDUCTOR MEMORY SYSTEM HAVING ECC CIRCUIT AND CONTROLLING METHOD THEREOF

(75) Inventor: Jun Rye Rho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 728 days.

(21) Appl. No.: 12/647,333

(22) Filed: Dec. 24, 2009

(65) Prior Publication Data

US 2011/0029841 A1    Feb. 3, 2011

(30) Foreign Application Priority Data

Jul. 29, 2009  (KR) .................. 10-2009-0069606

(51) Int. Cl.
 *G06F 11/00*    (2006.01)
(52) U.S. Cl.
 USPC .......................................................... 714/768
(58) Field of Classification Search
 USPC .................................. 714/763, 768, 785, 719
 See application file for complete search history.

(56) References Cited

U.S. PATENT DOCUMENTS

| | | | |
|---|---|---|---|
| 6,018,626 A | 1/2000 | Zook | |
| 6,751,123 B2 | 6/2004 | Katayama et al. | |
| 6,957,378 B2 * | 10/2005 | Koga et al. | 714/763 |
| 6,990,623 B2 * | 1/2006 | Furukawa | 714/773 |
| 8,010,876 B2 * | 8/2011 | Hsieh et al. | 714/773 |
| 2005/0204264 A1 * | 9/2005 | Yusa | 714/758 |
| 2007/0226597 A1 * | 9/2007 | Taito et al. | 714/785 |
| 2008/0072120 A1 | 3/2008 | Radke | |
| 2008/0163033 A1 * | 7/2008 | Yim | 714/785 |
| 2010/0332951 A1 * | 12/2010 | Peng et al. | 714/773 |

FOREIGN PATENT DOCUMENTS

| KR | 1020070093090 A | 9/2007 |
|---|---|---|
| KR | 10-0891332 B1 | 3/2009 |

* cited by examiner

*Primary Examiner* — Bryce Bonzo
*Assistant Examiner* — Elmira Mehrmanesh
(74) *Attorney, Agent, or Firm* — Ladas & Parry LLP

(57) ABSTRACT

A semiconductor memory system includes a memory area and an error-correcting (ECC) circuit. The memory area includes a plurality of cells, and the ECC circuit is configured to determine whether uncorrectable error data exists or not by using a parity according to cell data of the memory area in a read mode and a parity according to an encoding result of corrected data of the cell data.

11 Claims, 4 Drawing Sheets

SEMICONDUCTOR MEMORY SYSTEM HAVING ECC CIRCUIT AND CONTROLLING METHOD THEREOF

CROSS-REFERENCES TO RELATED APPLICATIONS

The present application claims priority under 35 U.S.C. §119(a) to Korean application number 10-2009-0069606, filed on Jul. 29, 2009, in the Korean Intellectual Property Office, which is incorporated herein by reference in its entirety as set forth in full.

BACKGROUND

The present invention relates to a semiconductor memory system and a controlling method thereof, and more particularly, to a semiconductor memory system having an ECC circuit and a controlling method thereof.

In recent semiconductor memory systems using NAND flash memories, when data is written to memory cells, threshold levels of the memory cells having stored data are frequently varied by malfunction or influence of adjacent cells on which a write operation is performed. The variation in the threshold levels degrades the accuracy of read data. In order to enhance the accuracy of data, error-correcting code (hereinafter, referred to as ECC) is added to data, and then a write operation and a read operation are performed.

Typically, semiconductor memory systems having ECC circuits generate and store parity bits as well as data bits, determine whether errors occur or not by using the parity bits, and correct the errors.

Meanwhile, when errors outside of a correctable range occur, the ECC circuits may correct errors and output corrected data, while not recognizing the situation. Hence, when errors are out of an error correction range, the ECC circuits may correct errors of read data incorrectly. For example, the occurrence of multiple bit errors caused by power failure during the operation of a semiconductor memory system is a situation that exceeds the error correction range. However, in this case, when data is corrected using the ECC circuit, the ECC circuit may determine the errors not as resulting from a power failure, but as defects of memory cells, that is, a read operation failure. Consequently, there is a need for methods that determine whether errors exceed the error correction range of the ECC circuit.

SUMMARY

A semiconductor memory system configured to determine the error correction possibility of a block is described herein.

A method for controlling a semiconductor memory system configured to determine the error correction possibility of a block is described herein.

In an aspect or embodiment of the invention, a semiconductor memory system includes: a memory area comprising a plurality of cells; and an error-correcting code (ECC) circuit configured to determine whether uncorrectable error data exists or not by using a parity according to cell data of the memory area in a read mode and a parity according to an encoding result of corrected data of the cell data.

In another aspect or embodiment of the invention, a semiconductor memory system includes: a memory area comprising a plurality of cells; an ECC codec comprising an ECC encoder configured to encode external data in a write mode, the ECC codec being configured to correct an error of cell data of the memory area by using the ECC encoder when reading the corresponding cell data, and to determine whether the error of the cell data exceeds an error correction range of the ECC encoder; and an error location solving block configured to provide a location of error data of the corresponding cell so as to correct the error of the corresponding cell data.

In another aspect or embodiment of the invention, a semiconductor memory system includes: a memory area comprising a plurality of cells; an ECC codec configured to primarily compare a parity generated by encoding external data in a write mode with a parity generated by encoding corresponding cell data in a read mode, and to secondarily compare a parity generated by correcting an error of the corresponding cell data with a parity generated by encoding corrected data; and an error location solving block configured to provide a location of error data of the corresponding cell so as to correct the error of the corresponding cell data in response to the primary comparison result.

In another aspect or embodiment of the invention, a method for controlling a semiconductor memory system includes: reading and encoding corresponding cell data to generate a parity; comparing a parity according to an encoding result in a write mode with a parity according to an encoding result of the corresponding cell data in a read mode; tracking an error location according to the comparison result; correcting an error of the corresponding cell data according to the error location tracking result, and encoding corrected data to generate a parity; and comparing a parity according to the corrected data with a parity according to the encoding of the corrected data.

BRIEF DESCRIPTION OF THE DRAWINGS

Features, aspects, and embodiments are described in conjunction with the attached drawings, in which.

DETAILED DESCRIPTION

As required, detailed embodiments of the present invention are disclosed herein. However, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Hereinafter, a semiconductor memory system having an ECC circuit and a controlling method thereof according to the present invention is described below with reference to the accompanying drawings through preferred aspects or embodiments.

Furthermore, the respective block diagrams may illustrate parts of modules, segments or codes including at least one or more executable instructions for performing specific logic function(s). Moreover, it should be noted that the functions of the blocks may be performed in different order in several modifications. For example, two successive blocks may be performed substantially at the same time, or may be performed in reverse order according to their functions.

A semiconductor memory system according to one embodiment will be described below with reference to FIG. 1.

Figure 1:
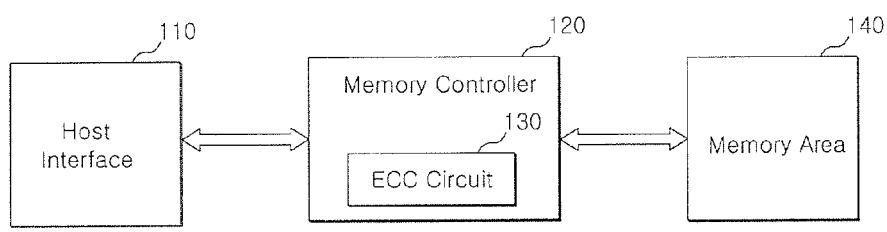
FIG. 1 is a block diagram of a semiconductor memory system according to one embodiment.

FIG. 1 is a block diagram of a semiconductor memory system 100 according to one embodiment. A system using a NAND flash memory is taken as an example of the semiconductor memory system 100 set forth herein.

Referring to FIG. 1, the semiconductor memory system 100 includes a host interface 110, a memory controller 120, and a memory area 140.

The host interface 110 is connected to the memory controller 120. The host interface 110 transmits and receives control commands, address signals, and data signals between an external host (not shown) and the memory controller 120. An interface scheme between the host interface 110 and the external host (not shown) may be any one of Serial Advanced Technology Attachment (SATA), Parallel Advanced Technology Attachment (PATA), SCSI, Express Card, and PCI-Express for example, but is not limited thereto.

The memory controller 120 includes an ECC circuit 130. Like a typical controller, the memory controller 120 is configured to receive input data and a write command from the host interface 110, and write the input data to the memory area 140. Likewise, when the memory controller 120 receives a read command from the host interface 110, the memory controller 120 reads data from the memory area 140 and outputs the read data to an external device.

Meanwhile, when there is an error in a data read from the memory area 140, the memory controller 120 corrects the error by using the ECC circuit 130 and outputs the corrected data. Specifically, according to one embodiment, the use of an encoder (not shown) included in the ECC circuit 130 makes it easy to determine whether uncorrectable error data is generated. That is, in the data error correction operation, the ECC circuit 130 may determine whether the data is uncorrectable error data or not by comparing a parity generated while again providing the corrected data to the encoder (not shown) with a parity of previous data. Features and operations of the ECC circuit 130 will be described below in detail.

According to one embodiment, by providing a large-sized cyclic redundancy check (CRC) circuit or adding an error measurement bit in order to determine whether the error exceeds the error correction range of the ECC circuit 130, the error data may be corrected and the error correction ability may be determined by appropriately using the embedded encoder (not shown), without calculation of syndrome. Thus, the area efficiency and time efficiency may be increased.

The memory area 140 is controlled by the memory controller 120 to perform a program operation, an erase operation, and a read operation. The memory area 140 may be a NAND flash memory, for example. For convenience of description, a single NAND flash memory is taken as an example, but it is apparent that the memory area 140 may be a plurality of NAND flash memories.

Figure 2:
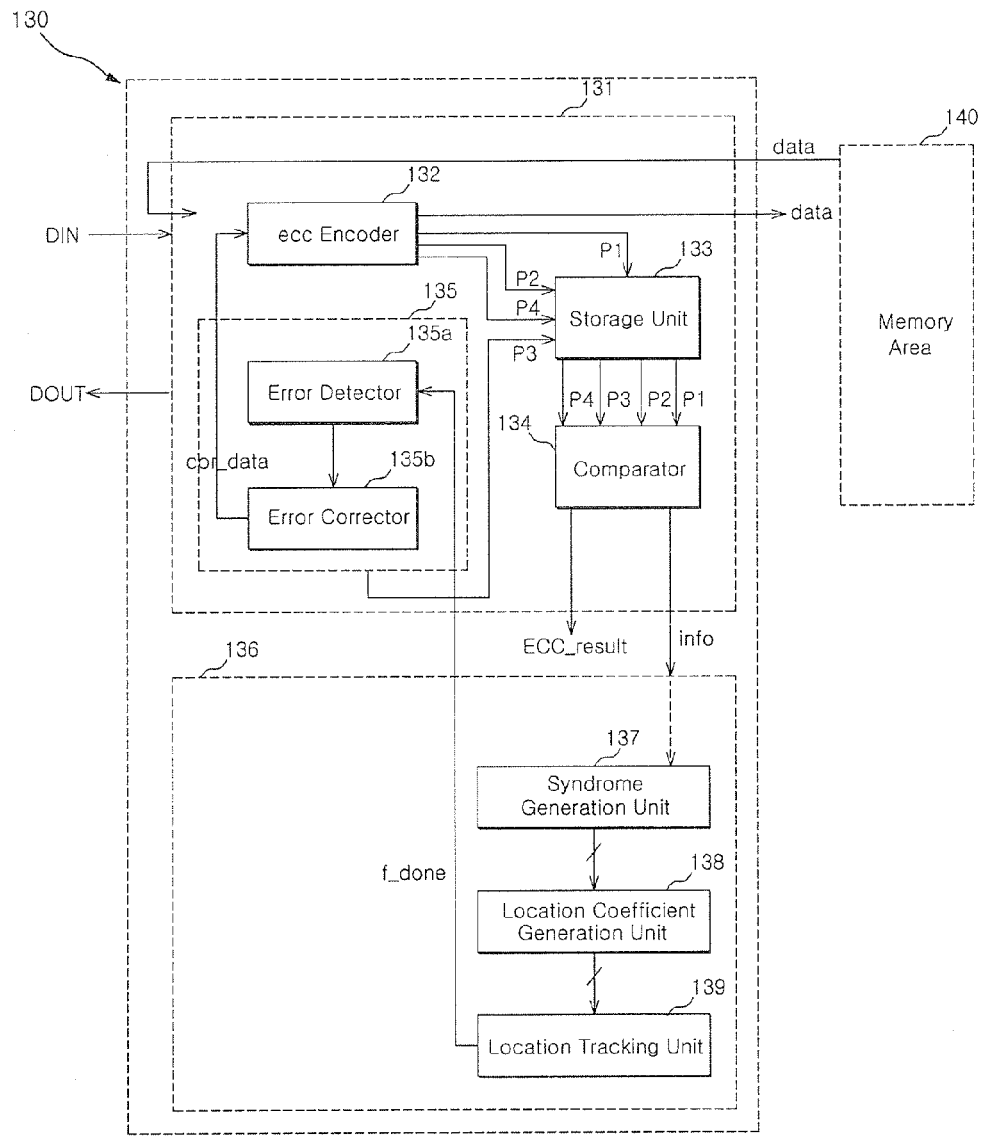
FIG. 2 is a block diagram of an ECC circuit of FIG. 1.
Figure 3:
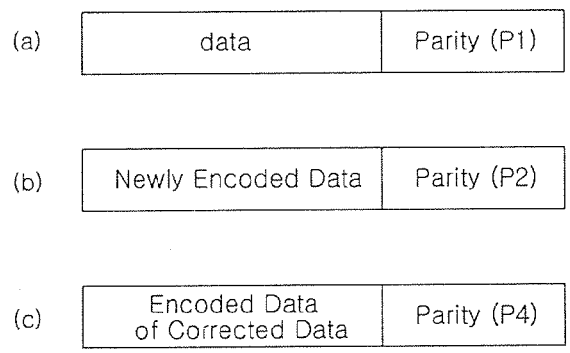
FIGS. 3 and 4 are block diagrams conceptually showing data structure in FIG. 2.
Figure 4:
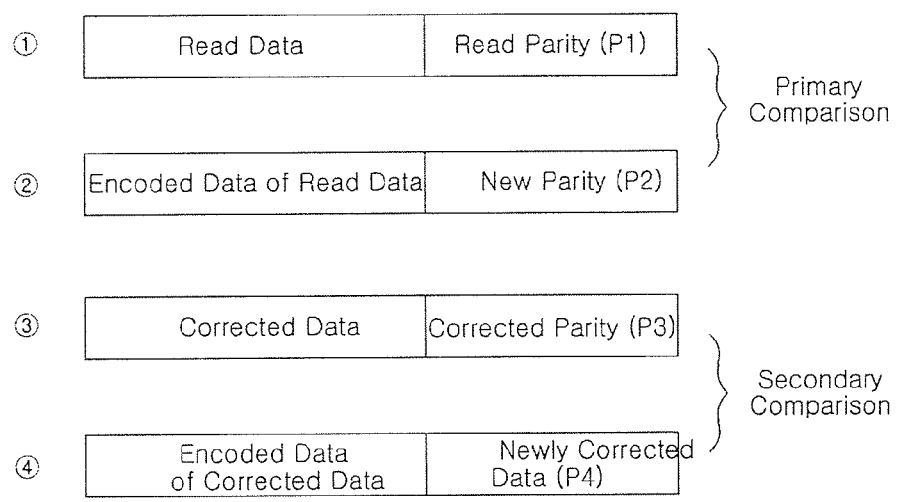

FIG. 2 is a block diagram illustrating the relationship between the ECC circuit 130 and the memory area 140. FIGS. 3 and 4 are block diagrams conceptually illustrating data structures of data shown in FIG. 2.

Referring to FIGS. 2 through 4, the ECC circuit 130 according to one embodiment includes an ECC codec 131 and an error location solving block 136.

The ECC codec 131 includes an ECC encoder 132, a storage unit 133, a comparison unit 134, and an ECC decoder 135. The ECC decoder 135 includes an error detector 135a and an error corrector 135b.

Furthermore, the error location solving block 136 includes a syndrome generation unit 137, a location coefficient generation unit 138, and a location tracking unit 139.

In more detail, in a write mode, the ECC encoder 132 encodes input data DIN provided from the host interface (110 in FIG. 1) to generate cell data 'data' and a first parity P1 as illustrated in (a) of FIG. 3. The cell data 'data' is stored in the memory area 140, but the first parity P1 is stored in the storage unit 133 of the ECC codec 131.

Also, according to one embodiment, in a read mode, the ECC encoder 132 encodes cell data 'data' read from the memory area 140 to additionally generate a second parity P2 as illustrated in (b) of FIG. 3. In this case, the newly encoded data may or may not be stored, but the second parity P2 is stored in the storage unit 133.

In addition, as described later, the ECC encoder 132 encodes corrected data cor_data outputted from the error corrector 135b to generate a fourth parity P4 as illustrated in (c) of FIG. 3. The fourth parity P4 is also stored in the storage unit 133.

As such, according to one embodiment, the ECC encoder 132 is controlled to be used in a read mode as well as a typical write mode. Therefore, by using the second parity P2 and the fourth parity P4 generated in the read mode, it may be determined whether uncorrectable error data exists or whether the error exceeds the error correction range.

As described above, the storage unit 133 stores the first to fourth parities P1 to P4. The storage unit 133 may be configured using a flip-flop or a latch circuit, for example.

The comparison unit 134 compares the first parity P1 with the second parity P2 to determine whether the value of the first parity P1 is identical to the value of the second parity P2, and provides comparison information signal_info. Furthermore, the comparison unit 134 compares the third parity P3 with the fourth parity P4 to determine whether the value of the third parity P3 is identical to the value of the fourth parity P4, and provides a correction result signal ECC_result. The comparison information signal_info is used for an error correction operation of the ECC decoder 135, and the correction result signal ECC_result is used for determining whether the error exceeds the error correction ability. For example, the comparison unit 134 may include a plurality of exclusive OR gates (EXOR).

In the read mode, the ECC decoder 135 corrects data according to the result of the error existence/non-existence in the cell data 'data' read from the memory area 140, and provides the corrected data as output data DOUT. Since the ECC decoder 135 is a typical ECC decoder, it will be described briefly. The error detector 135a receives a location tracking completion signal f_done from the error location solving block 136 and detects an error location. In addition, the error corrector 135b corrects data corresponding to the error location detected by the error detector 135a, and provides corrected data cor_data and a third parity P3 according to the corrected data cor_data.

Meanwhile, the syndrome generation unit 137 generates a multi-bit syndrome in response to the comparison result signal_info. Unlike a typical syndrome generation unit, the syndrome generation unit 137 operates in response to the comparison result signal_info based on the parity result. That is, since a conventional syndrome generation unit generates a syndrome by using cell data, the generation of syndrome requires execution cycle as long as the length of the data. However, since the syndrome generation unit 137 according to one embodiment generates the syndrome according to the comparison result signal_info, the execution time is reduced.

The location coefficient generation unit 138 generates a plurality of coefficients for a location tracking operation. The location coefficient generation unit 138 may use a typical SiMBA tool, for example.

The location tracking unit 139 finds an error location by using the location coefficients generated from the location coefficient generation unit 138. The location tracking unit 139 may calculate the error location by using Chien algorithm. Hence, when the location calculation of the location tracking unit 139 is completed, the location tracking unit 139 provides the location tracking completion signal f_done.

The operation of an embodiment of the ECC circuit 130 is described below.

In the write mode, the ECC encoder 132 encodes the input data DIN to provide the cell data 'data' and the first parity P1. The first parity P1 is stored in the storage unit 133.

Then, in the read mode, the cell data 'data' is read from the memory area 140, and the first parity P1 stored in the storage unit 133 is read at the same time (see ① of FIG. 4).

According to one embodiment, in order to determine whether an error exists in the cell data 'data', the read cell data is again encoded through the ECC encoder 132, and the parity at that time i.e., the second parity P2 is generated (see ② of FIG. 4).

The comparison unit 134 compares the first parity P1 with the second parity P2 to determine whether the first parity P1 is identical to the second parity P2. As described above, the first parity P1 is a parity based on the cell data 'data' encoded in the write mode, and the second parity P2 is a parity based on the read cell data 'data'. When the first parity P1 is identical to the second parity P2, it means that the read cell data 'data' and the cell data 'data' encoded in the write mode are identical to each other. Consequently, it can be known that no error exists in data. At this time, the comparison information signal_info may have a value of 0.

On the other hand, when the first parity P1 and the second parity P2 are not identical to each other, the comparison information signal_info having a value of 1 is provided to inform that an error exists in data.

The error detector 135*a* detects the error location according to the result signal f_done of the error location solving block 136, and the error corrector 135*b* corrects the data error to generate the corrected data cor_data and the third parity P3 (see ③ of FIG. 4).

According to one embodiment, the data error is corrected and simultaneously the corrected data is encoded to generate the fourth parity P4 (see ④ of FIG. 4).

The comparison unit 134 compares the third parity P3 with the fourth parity P4 to provide the correction result signal ECC_result. That is, in the primary comparison, the comparison unit 134 determines that a data error exists, and provides the corrected data cor_data and the third parity P3. Then, the corrected data cor_data is again encoded so as to determine whether an additional error exists in the corrected data cor_data. In other words, after correcting the data error, a secondary comparison for determining whether there is an additional correction or not is performed to determine whether an additional correction bit exists. Accordingly, when the third parity P is identical to the fourth parity P4, the error data bit is within the error correction ability of the ECC circuit 130, and thus, it can be known that the data correction is properly done. On the other hand, when the third parity P3 is not identical to the fourth parity P4, it means that an uncorrected error data bit still exists, regardless of the primary data error correction. Therefore, it means the error exceeds the error correction range of the ECC circuit 130. In this manner, a power failure is detected, and the execution of the operation of the corresponding device is stopped.

Figure 5:
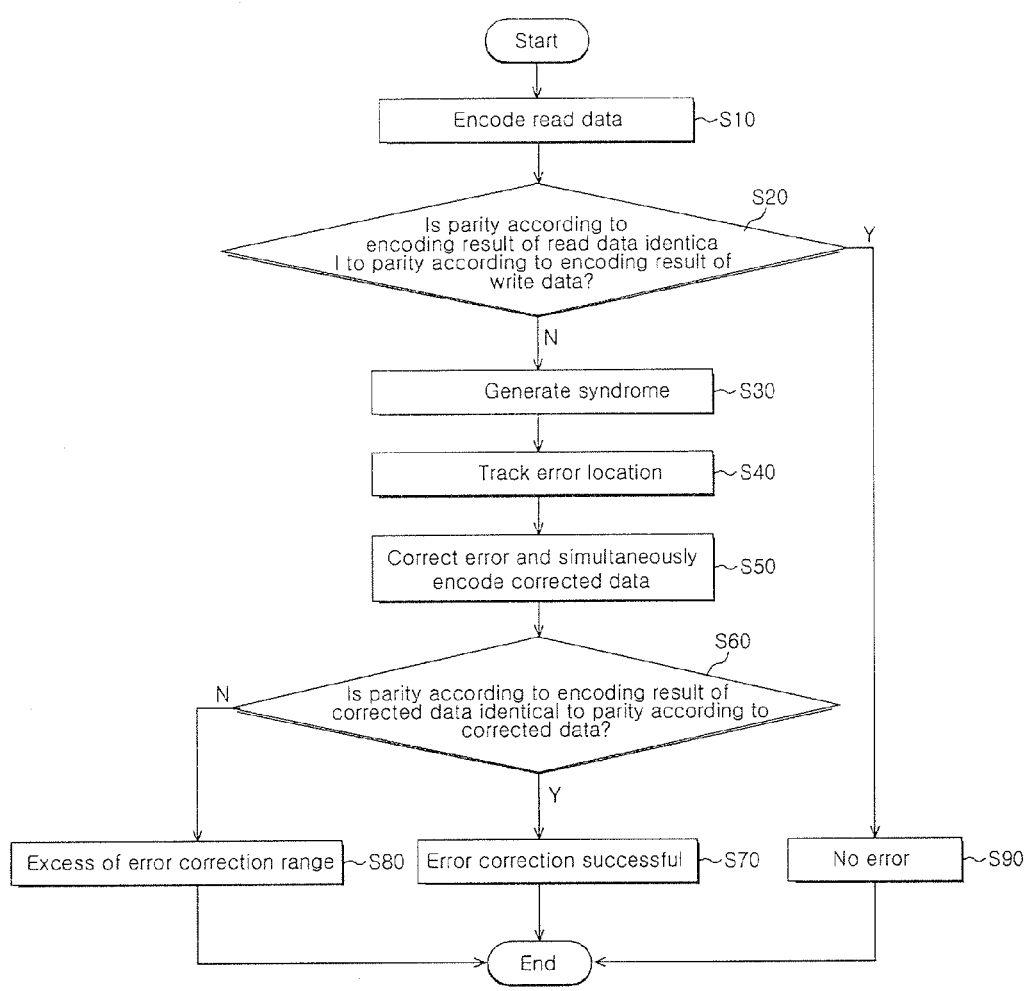
FIG. 5 is a flowchart illustrating a method for controlling a semiconductor memory system according to one embodiment.

FIG. 5 is a flowchart illustrating the operation of the semiconductor memory system 100 of FIG. 1.

Referring to FIGS. 1 through 5, in the write mode, the input data DIN is encoded to generate the cell data 'data' and the first parity P1. In the read mode, the corresponding cell data is read, and the first parity P1 stored in the storage unit 133 is read.

According to one embodiment, the corresponding cell data 'data' is read and encoded (S10). In reading and encoding the corresponding cell data 'data', the second parity P2 is generated.

The second parity P2 according to the encoding result of the data read in the read mode and the first parity P1 according to the encoding result of the data written in the write mode are compared to determine whether the second parity P2 is identical to the first parity P1.

When the second parity P2 is identical to the first parity P1, no error is detected (S90).

On the other hand, when the second parity P2 is not identical to the first parity P1, the syndrome is generated according to the comparison result (S30), and the error location is tracked (S40). Tracking of the error location includes generating the location coefficient by using the syndrome, and performing the location tracking algorithm by using the location coefficient.

The error of the cell data 'data' read according to the error location tracking result is corrected and simultaneously the corrected data cor_data is encoded to generate the fourth parity P4 (S50).

The third parity P3 according to the corrected data cor_data and the fourth parity P4 according to the encoding result of the corrected data cor_data are compared to determine whether the third parity P3 is identical to the fourth parity P4 (S60).

When the third parity P3 is identical to the fourth parity P4, it is determined that the error correction is successful (S70). On the other hand, when the third parity P3 is not identical to the fourth parity P4, it is determined the error exceeds the error correction range of the ECC circuit 130 (S80).

According to one embodiment, by appropriately using the encoder of the ECC encoder 130 in the read mode as well as the write mode, it may be easily determined whether the error exceeds the error correction range at the same time as the data error correction, without an additional correction engine.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor memory system comprising:
   a memory area comprising a plurality of cells; and
   an error-correcting code (ECC) circuit in communication with the memory area,
   wherein the ECC circuit is configured to generate a first parity by correcting cell data of the memory area and a second parity by encoding corrected data of the cell data and to determine whether the cell data exceeds an error correction range or not by comparing the first parity and the second parity in a read mode.

2. The semiconductor memory system according to claim 1, wherein the ECC circuit is configured to generate a third parity by encoding external data in a write mode and a fourth parity by encoding cell data in the read mode and to compare the third parity and the fourth parity.

3. The semiconductor memory system according to claim 2, wherein the ECC circuit is configured to detect an error between the external data and the cell data in the read mode when the third parity is not identical to the fourth parity.

4. The semiconductor memory system according to claim 3, wherein the ECC circuit is configured to detect whether an uncorrectable error data exists when the first parity is not identical to the second parity.

5. The semiconductor memory system according to claim 4, wherein the ECC circuit comprises:
- an ECC encoder configured to generate the second parity, the third parity and the fourth parity in both the write mode and the read mode;
- an error location solving block configured to provide a location of an error data of the cell data; and
- an ECC decoder configured to correct the error data according to the location of the error data and to generate the corrected data and the first parity.

6. The semiconductor memory system according to claim 5, wherein the ECC circuit further comprises:
- a storage unit configured to store the first to the fourth parities;
- a comparison unit configured to compare the first parity with the second parity, and compare the third parity with the fourth parity.

7. The semiconductor memory system according to claim 6, wherein the error location solving block comprises a location coefficient generation unit and a location tracking unit, wherein the error location solving block generates an error location coefficient according to the comparison result of the comparison unit, calculates the error location efficient, and tracks a location of the corresponding cell data.

8. The semiconductor memory system according to claim 7, wherein the error location solving block further comprises a syndrome generation unit configured to generate a syndrome for an error location calculation in response to a comparison result of the first parity and the second parity.

9. A method for controlling a semiconductor memory system, comprising:
- generating a first parity according to an encoding result in a write mode;
- reading and encoding corresponding cell data to generate a second parity in a read mode;
- primarily comparing the first parity with the second parity;
- tracking an error location according to a comparison result;
- correcting an error of the corresponding cell data according to the error location tracking result, and generating a third parity according to a correcting result;
- encoding corrected data to generate a fourth parity; and
- secondarily comparing the third parity with the fourth parity.

10. The method according to claim 9, wherein, when the first parity is identical to the second parity, it is determined that there is no error between the data in the write mode and the data in the read mode.

11. The method according to claim 9, wherein, when the third parity is not identical to the fourth parity, it is determined that there is an additional error in the corrected data.

* * * * *